(12) United States Patent
Chou et al.

(10) Patent No.: US 9,575,494 B2
(45) Date of Patent: Feb. 21, 2017

(54) MECHANISMS FOR PROCESSING WAFER

(71) Applicant: Taiwan Semiconductor Manufacturing Co., Ltd., Hsin-Chu (TW)

(72) Inventors: You-Hua Chou, Hsinchu (TW); Shih-Hung Chen, Zhubei (TW); Jian-Huah Chiou, New Taipei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 280 days.

(21) Appl. No.: 14/079,791

(22) Filed: Nov. 14, 2013

(65) Prior Publication Data
US 2015/0129044 A1 May 14, 2015

(51) Int. Cl.
*G05D 7/06* (2006.01)
*H01L 21/67* (2006.01)

(52) U.S. Cl.
CPC ....... *G05D 7/0658* (2013.01); *H01L 21/67253* (2013.01); *Y10T 137/0396* (2015.04); *Y10T 137/7761* (2015.04); *Y10T 137/86002* (2015.04); *Y10T 137/86083* (2015.04); *Y10T 137/87676* (2015.04); *Y10T 137/87684* (2015.04)

(58) Field of Classification Search
CPC ............ G05D 16/2026; G05D 16/2066; Y10T 137/87571; Y10T 137/87676; Y10T 137/87684; Y10T 137/87692; Y10T 137/86083

USPC ................. 137/487.5, 561 A, 602, 605, 606, 607,137/565.23; 156/345.26; 118/715–733
See application file for complete search history.

(56) References Cited

U.S. PATENT DOCUMENTS

| | | | | |
|---|---|---|---|---|
| 4,936,877 A * | 6/1990 | Hultquist | ............... | B01D 53/22 95/12 |
| 5,575,853 A * | 11/1996 | Arami | ................. | C23C 16/4412 118/708 |
| 6,041,817 A * | 3/2000 | Guertin | ................... | F16K 51/02 137/565.23 |
| 6,251,192 B1 * | 6/2001 | Kawamura | ............ | C23C 16/54 118/719 |
| 6,711,956 B2 * | 3/2004 | Lin | .................... | G05D 16/2013 137/487.5 |
| 6,817,377 B1 * | 11/2004 | Reimer | ............. | H01L 21/67017 118/715 |
| 6,916,397 B2 * | 7/2005 | Pfeiffer | ............. | H01L 21/67253 118/719 |
| 7,137,400 B2 * | 11/2006 | Bevers | .................. | G01F 25/003 137/1 |
| 7,194,821 B2 * | 3/2007 | Edamura | ............ | G05D 16/2066 118/724 |
| 8,709,528 B2 * | 4/2014 | Cheng | ............... | H01L 21/68785 118/712 |

(Continued)

*Primary Examiner* — William McCalister
(74) *Attorney, Agent, or Firm* — McClure, Qualey & Rodack, LLP

(57) ABSTRACT

Embodiments of mechanisms for processing a wafer are provided. A method for processing a wafer includes creating an exhaust flow in a fluid conduit assembly that is connected to a process module used for processing the wafer. The method also includes detecting the exhaust pressure in the fluid conduit assembly. The method further includes determining whether the exhaust pressure meets a set point. In addition, the method includes regulating the exhaust flow if the exhaust pressure fails to meet the set point.

11 Claims, 5 Drawing Sheets

(56) References Cited

U.S. PATENT DOCUMENTS

| | | | | |
|---|---|---|---|---|
| 2007/0240769 | A1* | 10/2007 | Suzuki | G05D 7/0635 137/487.5 |
| 2010/0227480 | A1* | 9/2010 | Van De Kerkhof | G05D 16/2066 438/795 |
| 2010/0269911 | A1* | 10/2010 | Baltussen | B82Y 10/00 137/14 |
| 2011/0265884 | A1* | 11/2011 | Xu | H01L 21/67017 137/14 |
| 2013/0295297 | A1* | 11/2013 | Chou | C23C 16/5096 427/569 |
| 2013/0308411 | A1* | 11/2013 | Wittbold | B05C 5/0254 366/2 |
| 2015/0101482 | A1* | 4/2015 | Chou | B08B 17/00 95/12 |

* cited by examiner

MECHANISMS FOR PROCESSING WAFER

BACKGROUND

In the manufacturing of a product, the product is usually processed at many work stations or process machines. For example, to complete the fabrication of semiconductor wafers, various processing steps including deposition, cleaning, ion implantation, etching and passivation may be carried out before the semiconductor wafers are packaged for shipment.

In the vast majority of the processing steps, a special environment of either a high vacuum, low vacuum, gas plasma or other chemical environment is provided for the semiconductor wafers in the work stations or process machines. For instance, in a sputter process machine, a high vacuum environment is provided to surround the semiconductor wafer. Metal particles sputtered from a metal target can therefore travel toward and be deposited on the exposed surface of the semiconductor wafer. In other process machines, such as in a plasma enhanced chemical vapor deposition chamber, the plasma cloud of a reactant gas is formed over the semiconductor wafer positioned in a process chamber such that deposition of a chemical substance can occur on the semiconductor wafer.

During the manufacturing processes, contaminants such as particles, organics, gases, metallics, and the like, may adhere or adversely affect the semiconductor wafer, thereby adversely affecting the characteristics of the processed semiconductor device. Also, such contaminants can also be released into the clean room environment, where they may be hazardous to people or the environment.

Accordingly, there is a need to control the emission of contaminants during and between the manufacturing processes.

BRIEF DESCRIPTION OF THE DRAWINGS

For a more complete understanding of the embodiments and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
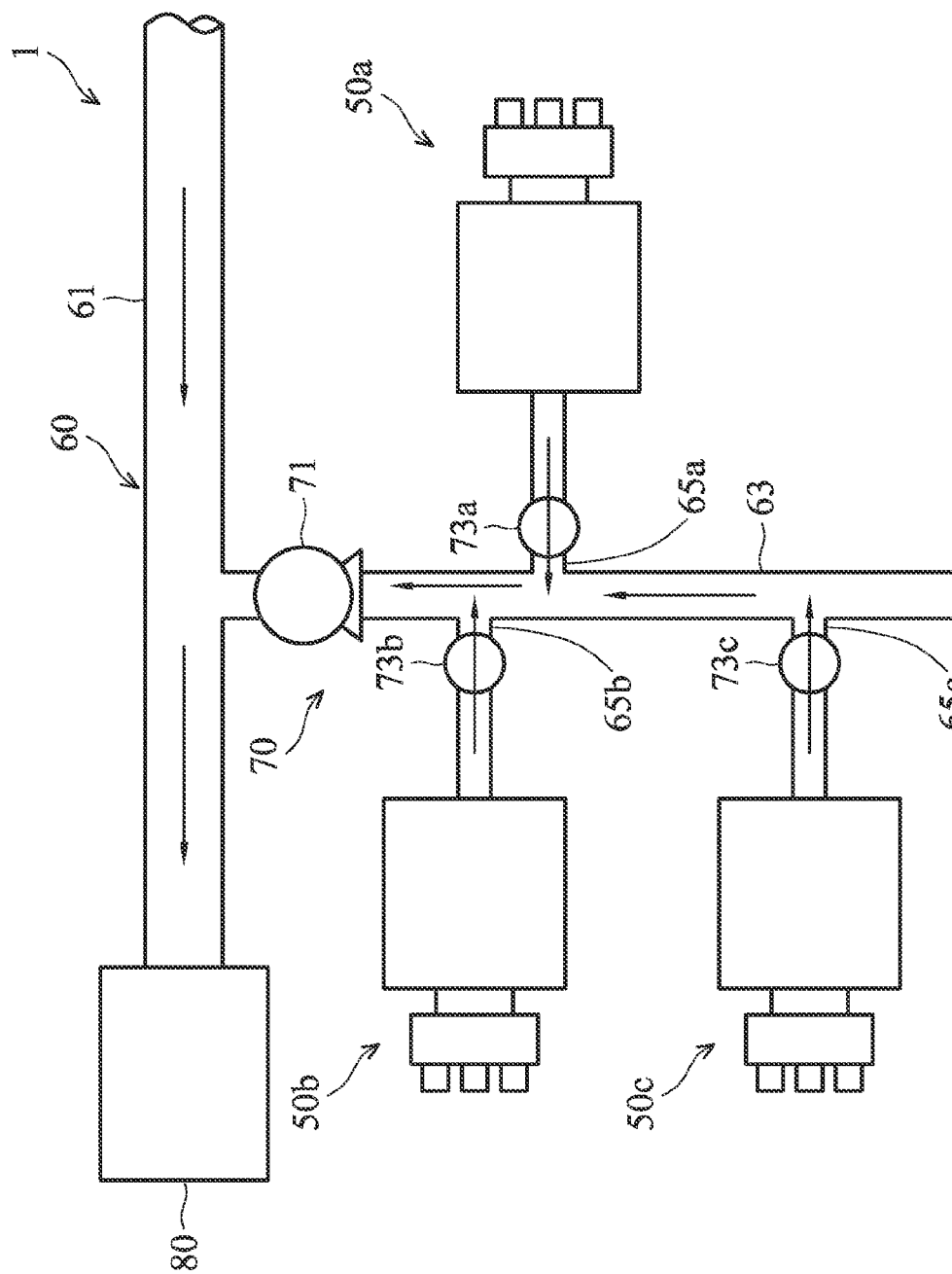
FIG. 1 shows a schematic view of a system for processing a wafer, in accordance with some embodiments.

Referring to FIG. 1, a schematic view of a processing system 1 is illustrated, in accordance with some embodiments. In some embodiments, the processing system 1 includes one or more than one processing apparatus, such as processing apparatuses 50a, 50b, and 50c, a fluid conduit assembly 60, a flow-control assembly 70 and a gas handling apparatus 80. It is appreciated that the number of the processing apparatuses 50a, 50b, and 50c can be varied according to different manufacturing procedures.

The processing apparatuses 50a, 50b, and 50c are configured to perform manufacturing procedures involved in the processing of one or more than one wafer. The wafer processed by the processing apparatuses 50a, 50b, and 50c may include a semiconductor, conductor, and/or insulator layers. In some embodiments, the wafer includes layered semiconductors. Examples include the layering of a semiconductor layer on an insulator such as that used to produce a silicon-on-insulator (SOI) wafer, a silicon-on-sapphire wafer, or a silicon-germanium-on-insulator wafer, or the layering of a semiconductor on glass to produce a thin film transistor (TFT). The wafer may go through many processing steps, such as lithography, etching, and/or doping before a completed die is formed.

Figure 2:
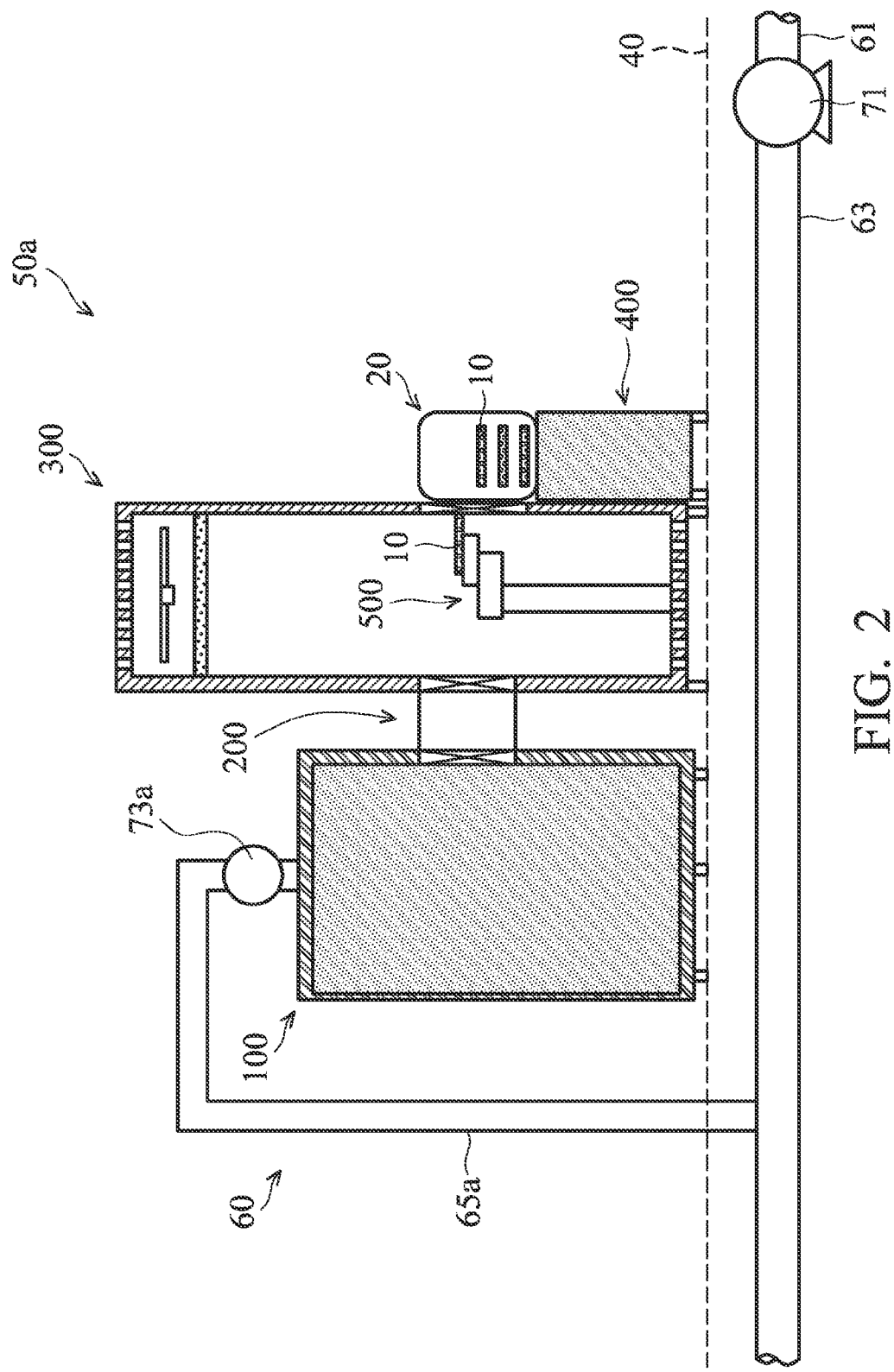
FIG. 2 shows a schematic view of a portion of a system for processing a wafer, in accordance with some embodiments.

According to the different manufacturing procedures that the processing apparatuses 50a, 50b, and 50c performs, the processing apparatuses 50a, 50b, and 50c can includes different features. For example, as shown in FIG. 2, the processing apparatus 50a includes a process module 100, a load lock module 200, an interface module 300, one or more load port 400, and one or more wafer transfer module 500, in accordance with some embodiments. It is appreciated that the features described below can be replaced or eliminated in other embodiments of the processing apparatus 50a.

In some embodiments, the process module 100 may be configured to perform any manufacturing procedure on a wafer 10. In some embodiments, the process module 100 is configured to perform manufacturing procedures that include deposition processes such as physical vapor deposition (PVD), chemical vapor deposition (CVD), plasma-enhanced chemical vapor deposition (PECVD) and/or other deposition processes. In some embodiments, the process module 100 is configured to perform manufacturing procedures that include etching processes such as wet etching, dry etching or ion beam milling. In some embodiments, the process module 100 is configured to perform manufacturing procedures including lithographic exposure, ion implantation, thermal processes, cleaning processes, testing, any procedure involved in the processing of the wafer 10, and/or any combination of such procedures.

The load lock module 200 is arranged between the process module 100 and the interface module 300. The load lock module 200 is configured for preserving the atmosphere within the process module 100 by separating it from the interface module 300. When the wafer 10 is inserted into the load lock module 200, the load lock module 200 is sealed. The load lock module 200 is capable of creating an atmosphere compatible with the process module 100 or the interface module 300 depending on where the loaded wafer 10 is scheduled to be next. This can be performed by altering the gas content of the load lock module 200 by such mechanisms as adding gas or creating a vacuum, along with other suitable means for adjusting atmosphere in the load lock module 200. When the correct atmosphere has been reached, the wafer 10 can be accessed.

In some embodiments, the interface module 300 is a facility interface. In some embodiments, the interface module 300 includes an equipment front end module (EFEM). In some embodiments, the load port 400 is adjacent to the interface module 300. In some embodiments, an overhead hoist transport (OHT) (not shown) transports a carrier 20, such as a standard mechanical interface (SMIF) or a front opening unified pod (FOUP) with the wafer 10 from a stocker (not shown) to the load port 400. When the carrier 20 is located on the load port 400, the wafer 10 in the carrier 20 is transferred to the interface module 300 by the wafer transfer module 500.

In some embodiments, the wafer transfer module 500 is positioned in the interface module 300. In some other embodiments, the processing apparatus 50a includes multiple wafer transfer modules 500. One of the wafer transfer modules 500 is positioned in the interface module 300, and another wafer transfer module 500 is positioned in the process module 100.

In some embodiments, a radial and rotational movement of the wafer transfer module 500 can be coordinated or combined in order to pick up, transfer, and deliver the wafer 10 from one location within the processing apparatus 50a to another. For example, with the wafer transfer module 500, the wafer 10 is transferred between the carrier 20 and the load lock module 200. In some other embodiments, the wafer 10 is transferred between the load lock module 200 and one or more processing chamber (not shown in FIG. 2) of the process module 100 by the wafer transfer module 500.

Referring again to FIG. 1, the fluid conduit assembly 60 includes a main conduit 61, a domain conduit 63, one or more than one gas line, such as gas lines 65a, 65b, and 65c, in accordance with some embodiments.

The main conduit 61 is fluidly connected between the gas handling apparatus 80 and the domain conduit 63. The main conduit 61 allows the flow of gas from the domain conduit 63 to the gas handling apparatus 80. In some embodiments, the processing system 1 includes a number of domain conduits 63. The domain conduits 63 are fluidly connected to the main conduit 61, and the flow of gas from each domain conduit 63 is moved to the gas handling apparatus 80 via the main conduit 61. In some embodiments, the main conduit 61 and the domain conduit 63 are located below a manufacturing floor 40 (FIG. 2) at which the processing apparatuses 50a, 50b, and 50c are positioned.

The gas lines 65a, 65b, and 65c are respectively fluidly connected between the domain conduit 63 and the processing apparatuses 50a, 50b, and 50c. In some embodiments, the gas lines 65a, 65b, and 65c are physically connected to any portion of the processing apparatuses 50a, 50b, and 50c.

For example, as shown in FIG. 2, the gas line 65a is connected between the process module 100 of the processing apparatus 50a and the domain conduit 63. In some embodiments, the gas lines 65a, 65b, and 65c are closer to the corresponding processing apparatuses 50a, 50b, and 50c than the main conduit 61. The gas lines 65a, 65b, and 65c are located in upstream ends of the fluid conduit assembly 60.

The number of gas lines can be varied according to demand. In some embodiments, the number of gas lines corresponds to the number of processing apparatuses. In some other embodiments, the number of the gas lines is greater or less than the number of the processing apparatuses. Some of the processing apparatuses may connect to one or more than one gas line, and some of the processing apparatuses may not connect to a gas line.

In some embodiments, the cross-sectional area of each of the gas lines 65a, 65b, and 65c is smaller than that of the domain conduit 63. In some embodiments, the gas lines 65a, 65b, and 65c can easily be inserted or removed from the domain conduit 63 so as to allow the quick and easy removal, replacement or addition of processing apparatuses 50a, 50b, and 50c.

The flow-control assembly 70 includes a domain control member 71, and one or more than one local control member, such as local control members 73a, 73b, and 73c, in accordance with some embodiments. The domain control member 71 is positioned in the domain conduit 63 and configured to produce an exhaust flow in the domain conduit 63 and the gas lines 65a, 65b, and 65c, as indicated by the arrows in FIG. 1.

The position of the domain control member 71 can be varied according to demands. For example, the domain control member 71 is positioned in an end of the domain conduit 63 that is connected to the main conduit 61. The domain control member 71 includes, for example, a fan, a blower or a pump. The domain control member 71 actuates an exhaust flow in the domain conduit 63, and the gas in the processing apparatuses 50a, 50b, and 50c is exhausted to the gas handling apparatus 80 via the main conduit 61.

The local control members 73a, 73b, and 73c are respectively mounted in the gas lines 65a, 65b, and 65c. In some embodiments, the local control members 73a, 73b, and 73c are throttle valves. By adjusting the angle of a valve member of each throttle valve through proper means such as a motor, the amount of the exhaust flow from the corresponding processing apparatuses 50a, 50b, and 50c are regulated.

The gas handling apparatus 80 is connected to one end of the main conduit 61. According to manufacturing requirements, the gas handling apparatus 80 may contain filtering capacity as well as air movement capabilities. For example, the gas handling apparatus 80 includes a fan (not shown in FIG. 1), a filter assembly (not shown in FIG. 1) to clean gas, and a gas cooling assembly (not shown in FIG. 1) to cool gas.

In some embodiments, there are some toxic gases in the processing apparatuses 50a, 50b, and 50c. Through the arrangement mentioned above, the toxic gases can be exhausted from the processing apparatuses 50a, 50b, and 50c and be handled by the gas handling apparatus 80. Therefore, the contamination risk of the wafer 10 in the processing apparatuses 50a, 50b, and 50c is reduced, and the production yield of the processing system 1 is improved. In addition, since the exhaust gas from the processing apparatuses 50a, 50b, and 50c is handled by the gas handling apparatus 80 before it is vented out to the exterior environment, the worker can be protected from hazards.

However, since the exhaust flow in the domain conduit 63 is mainly actuated by the domain control member 71, the exhaust pressure in the domain conduit 63 is constant. As a result, once the exhaust pressure in one of the gas lines 65a, 65b, and 65c is modified, the exhaust pressure in the other gas lines 65a, 65b, and 65c may be affected accordingly. For example, if the exhaust pressure in the gas line 65a is increased, the exhaust pressure in the gas lines 65b and 65c will decrease.

In addition, in some embodiments, the content of the gas in each of the processing apparatuses 50a, 50b, and 50c is varied during different operation statuses. Therefore, if the amount of exhaust gas from the corresponding processing apparatuses 50a, 50b, and 50c cannot be modified accordingly, the wafer 10 in the processing apparatuses 50a, 50b, and 50c may become contaminated.

Therefore, it is desirable to find an alternative processing system 1', which is capable of reducing or resolving the problems mentioned above.

Figure 3:
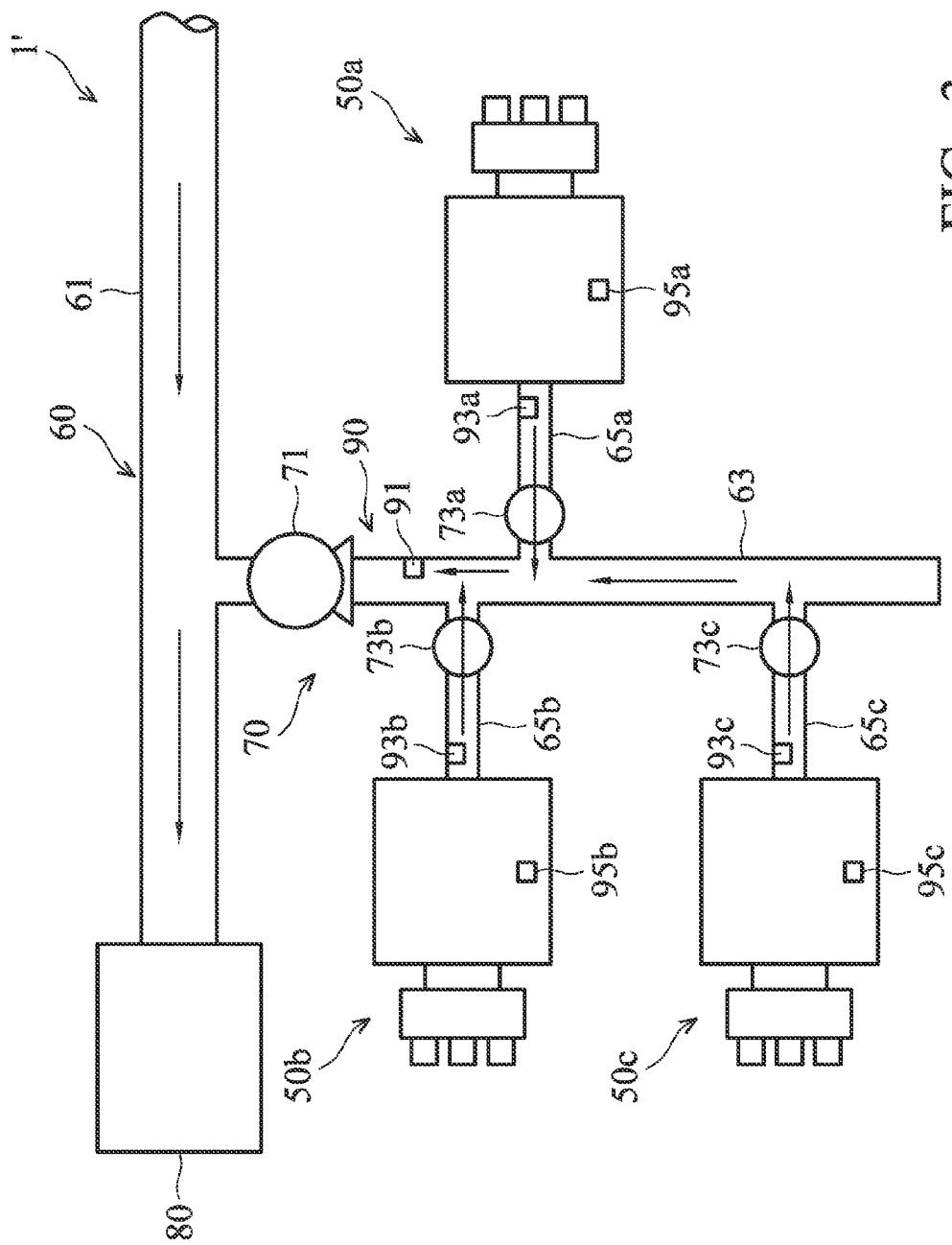
FIG. 3 shows a schematic view of a system for processing a wafer, in accordance with some embodiments.

Referring to FIG. 3, a schematic view of the processing system 1' is illustrated, in accordance with some embodiments. In some embodiments, differences between the processing system 1' and the processing system 1 include the processing system 1' further including a detection assembly 90. The detection assembly 90 includes a domain sensor 91, one or more than one local sensor, such as local sensors 93a, 93b, and 93c, and one or more than one ambient sensor, such as ambient sensors 95a, 95b, and 95c, in accordance with some embodiments.

The domain sensor 91 can be positioned in any location in the domain conduit 63 and configured to sense the exhaust pressure in the domain conduit 63. In some embodiments, the domain sensor 91 is positioned in a section of the fluid conduit assembly 60 that is away from the process module. For example, the domain sensor 91 is positioned adjacent to the domain control member 71. In some other non-illustrated embodiments, the detection assembly 90 includes multiple domain sensors 91. One of the domain sensors 91 is mounted in an end portion of the domain conduit 63 that is away from the main conduit 61. Another one of the domain sensors 91 is mounted in a middle portion of the domain conduit 63. Still another one of the domain sensors 91 is mounted in the end of the end portion of the domain conduit 63 that is adjacent to the main conduit 61. In some embodiments, the domain sensor 91 include a pitot tube.

The local sensors 93a, 93b, and 93c are respectively mounted in the gas lines 65a, 65b, and 65c and configured to sense the exhaust pressure in the corresponding gas lines 65a, 65b, and 65c. In some embodiments, each of the local sensors 93a, 93b, and 93c respectively includes a Pitot tube.

The ambient sensors 95a, 95b, and 95c are respectively mounted in the processing apparatuses 50a, 50b, and 50c. The ambient sensors 95a, 95b, and 95c, for example, are configured to sense ambient temperature in the processing apparatuses 50a, 50b, and 50c. Alternatively or additionally, the ambient sensors 95a, 95b, and 95c are configured to sense the concentration of toxic gas in the processing apparatuses 50a, 50b, and 50c.

Figure 4:
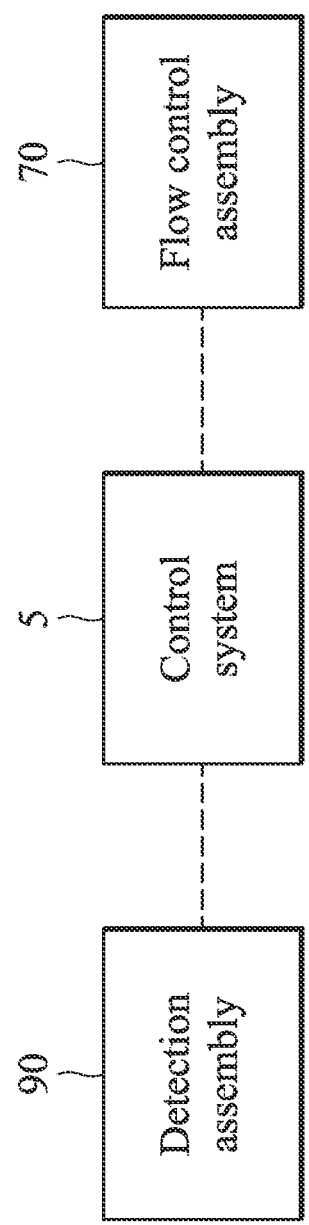
FIG. 4 shows a diagrammatic view of a portion of a system for processing a wafer, in accordance with some embodiments.

As shown in FIG. 4, the detection assembly 90 is electrically connected to a control system 5. In some embodiments, the control system 5 includes a fault detection and classification (FDC) system. The FDC system may include a data processor mechanism configured to process the real time data from the detection assembly 90. The control system 5 controls the operation of the flow-control assembly 70 based on real time data from the detection assembly 90.

Figure 5:
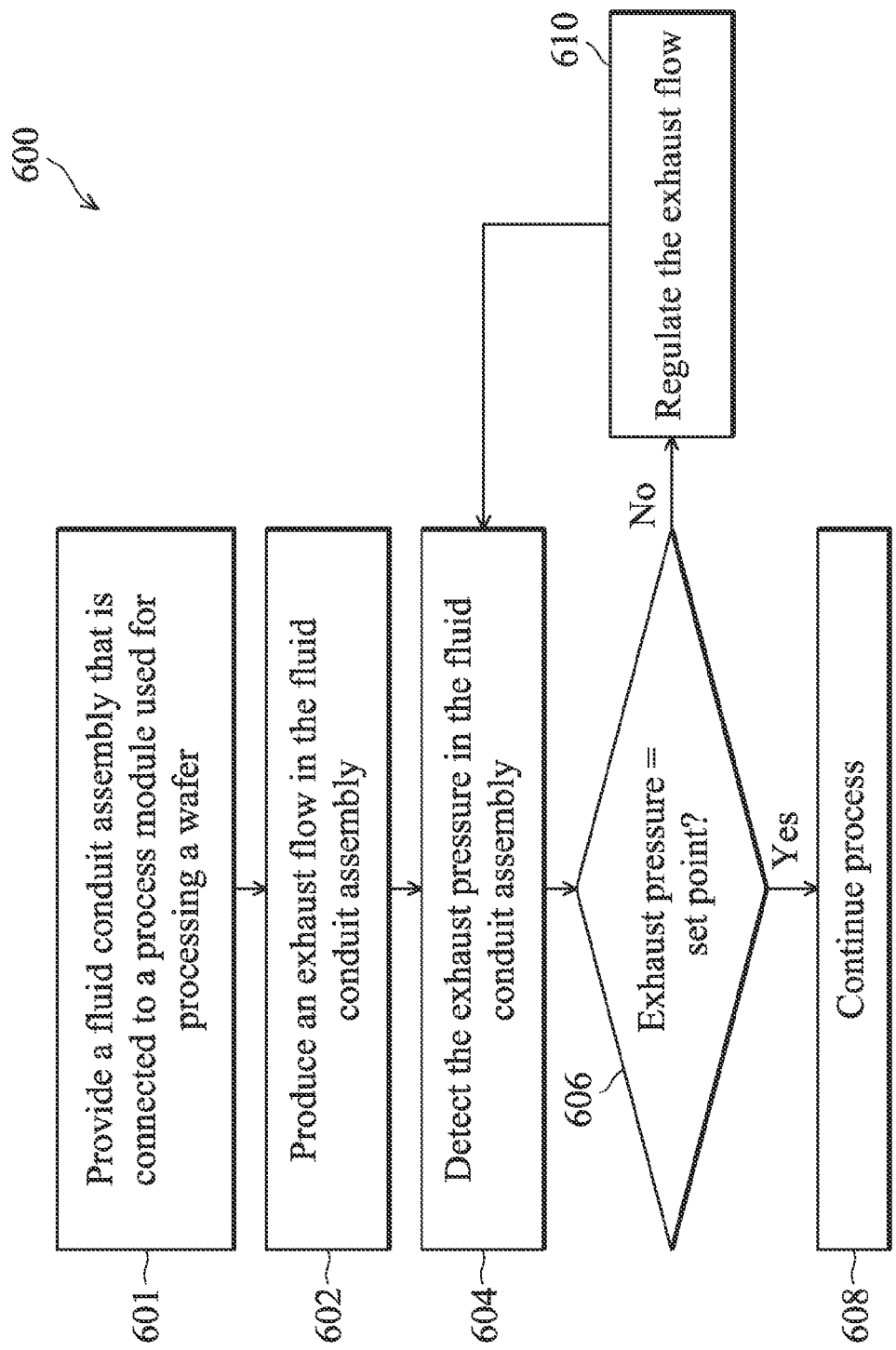
FIG. 5 shows a flow chart illustrating a method for processing a wafer, in accordance with some embodiments.

Referring to FIG. 5, a flow chart illustrating a method 600 for regulating the exhaust gas in a processing system (such as processing system 1') is shown, in accordance with some embodiments.

The method 600 begins with operation 601, in which a fluid conduit assembly is provided (such as the fluid conduit assembly 60 as shown in FIG. 3). The fluid conduit assembly 60 is fluidly connected to one or more than one process apparatuses (such as the processing apparatuses 50a, 50b, and 50c as shown in FIG. 3).

The method 600 continues with operation 602, in which an exhaust flow is produced by a flow-control assembly (such as the flow-control assembly 70 as shown in FIG. 3) in the fluid conduit assembly 60. As a result, the gas is drawn out from the processing apparatuses 50a, 50b, and 50c to a gas handling apparatus (such as gas handling apparatus 80) via the fluid conduit assembly 60.

The method 600 continues with operation 604, in which the exhaust pressure in the fluid conduit assembly 60 is detected by a detection assembly (such as the detection assembly 90). In some embodiments, the exhaust pressure in each of the domain conduit 63 and the gas lines 65a, 65b, and 65c is detected. In some other embodiments, only the exhaust pressure in some of the gas lines 65a, 65b, and 65c is detected. For example, the exhaust pressure in the gas line 65c is detected because the gas line 65c is farthest away from the domain control member 71 and has the lowest exhaust pressure. In some embodiments, either the temperature or the concentration of toxic gas in the processing apparatuses 50a, 50b, and 50c is detected by the detection assembly 90.

The method 600 continues with operation 606, in which the exhaust pressure in each location in the fluid conduit assembly 60 is determined. In some embodiments, if the exhaust pressure in the fluid conduit assembly 60 meet a set point, then the method is continued to operation 608. There is no need to adjust the flow-control assembly 70, and the process is continued. On the other hand, if the exhaust pressure in any location in fluid conduit assembly 60 does not meet the set point, then the method is continued to operation 610. The exhaust flow in the fluid conduit assembly 60 is regulated by the flow-control assembly 70.

For example, in some embodiments, when the exhaust pressure detected by the local sensor 93a is larger than the set point, an electrical signal is issued by the local sensor 93a. Afterwards, the local control member 73a is operated in response the electrical signal generated by the local sensor 93a. Therefore, a smaller amount of exhaust flow passing through the gas line 65a is passed through the local control member 73a. Namely, the amount of exhaust flow passing through a section of the fluid conduit assembly 60 that is close to the process module 50a is adjusted.

In some embodiments, when the exhaust pressure detected by the local sensors 93a, 93b, and 93c is too large to be regulated by the local control members 73a, 73b, and 73c, electrical signals are issued by the local sensors 93a, 93b, and 93c. Afterwards, the domain control member 71 is operated in response to the electrical signal generated by the local sensors 93a, 93b, and 93c. As a result, the velocity of the exhaust flow in the domain conduit 63 and the gas lines 65a, 65b, and 65c is decreased, so as to prevent damage to the local control members 73a, 73b, and 73c.

In some embodiments, when the exhaust pressure detected by the domain sensor 91 is too high to be regulated by the domain control member 71, an electrical signal is issued by the local sensor 93a, 93b, 93c. The electrical signal results in a decrease of velocity of exhaust flow produced by the gas handling apparatus 80 so as to prevent damage to the flow-control assembly 70.

In some embodiments, a malfunction or abnormality in the flow-control assembly 70 occurs, and the exhaust pressure in the fluid conduit assembly 60 is not regulated within a predetermined period of time. An electrical signal is issued. The electrical signal results in an interruption of the exhaust process to await manual intervention in order to correct the problem.

In some embodiments, the set point is set according to the concentration of toxic gas in the process module 50a, 50b, and 50c. Alternatively or additionally, the set point is set according to the temperature in the process module 50a, 50b, and 50c. For example, if the concentration of toxic gas in the process module 50a, 50b, and 50c is higher than a standard value, the set point is set to be higher than a normal value. Therefore, the exhaust pressure in the gas lines 65a, 65b, and 65c is adjusted to be higher, and the amount of gas removed from the process module 50a, 50b, and 50c is increased.

Embodiments of the disclosure have many advantages. For example, the toxic gas is removed from the process module 100, as such contamination risk of the wafer 10 is decreased. In addition, since the exhaust pressure in the fluid conduit assembly 60 is monitored and controlled in real time, the exhaust pressure can be maintained stably.

Embodiments of mechanisms for exhausting gas from a process module are provided. The exhaust pressure in a fluid conduit assembly is detected by a detection assembly in real time and regulated by a flow-control assembly. Since the exhaust pressure is maintained at a set point, exhaust fluctuation is avoided. Therefore, the manufacturing efficiency and production yield of the wafer are greatly improved.

In accordance with some embodiments, a system for processing a wafer is provided. The system includes a process module and a fluid conduit assembly. The process module is configured to process the wafer. The fluid conduit assembly is fluidly connected to the process module. The system also includes a detection assembly. The detection assembly is positioned in the fluid conduit assembly. The detection assembly is configured to detect the exhaust pressure in the fluid conduit assembly and produce an electrical signal which varies with the exhaust pressure. The system further includes a flow-control assembly. The flow-control assembly is positioned in the fluid conduit assembly. The flow-control assembly is configured to regulate an exhaust flow in the fluid conduit assembly according to the electrical signal produced by the detection assembly.

In accordance with some embodiments, a system for processing a wafer is provided. The system includes a process module and a fluid conduit assembly. The process module is configured to process the wafer. The fluid conduit assembly is fluidly connected to the process module. The system also includes a local sensor. The local sensor is positioned in a section of the fluid conduit assembly that is adjacent to the process module. The local sensor is configured to detect the exhaust pressure in the section of the fluid conduit assembly and produce an electrical signal which varies with the exhaust pressure. The system further includes a flow-control assembly. The flow-control assembly is positioned in the fluid conduit assembly. The flow-control assembly is configured to regulate an exhaust flow in the fluid conduit assembly according to the electrical signal produced by the detection assembly.

In accordance with some embodiments, a method for processing a wafer is provided. The method includes providing a fluid conduit assembly that is connected to a process module used for processing the wafer. The method also producing an exhaust flow in the fluid conduit assembly. The method further includes detecting the exhaust pressure in the fluid conduit assembly. In addition, the method further includes determining whether the exhaust pressure meets a set point. Moreover, the method includes regulating the exhaust flow if the exhaust pressure fails to meet the set point.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A system for processing wafers, comprising:
a plurality of process modules configured to process the wafers;
a gas handling apparatus;
a fluid conduit assembly comprising:
a domain conduit; and
a plurality of gas lines connecting each of the process modules to the domain conduit, wherein the domain conduit and the gas lines are configured to guide an exhaust flow from the process modules to the gas handling apparatus;
a detection assembly positioned in the fluid conduit assembly and configured to detect the exhaust pressures in the fluid conduit assembly and produce electrical signals which vary with the exhaust pressures;
wherein the detection assembly further comprises a domain sensor, disposed in the domain conduit for detecting the exhaust pressure in the domain conduit, and two local sensors disposed in a first and a second of the gas lines for detecting the exhaust pressure in the corresponding gas line;
a flow-control assembly positioned in the fluid conduit assembly and configured to regulate an exhaust flow in the fluid conduit assembly according to the electrical signals produced by the detection assembly;
wherein the flow-control assembly comprises:
a domain control member positioned in the domain conduit and configured to actuate an exhaust flow from the process modules to the gas handling apparatus via the gas lines and the domain conduit; and
two local control members, respectively disposed in the first and the second of the gas lines, arranged such that the flow rates of the exhaust flow in the first and the second of the gas lines are adjustable from a first value to a second value in which both are greater than 0 by the corresponding local control member according to the detected exhaust pressure of the corresponding gas line;

wherein the first of the gas lines and the second of the gas lines are respectively connected to the domain conduit at a first meeting point and a second meeting point, wherein the first meeting point is further away from the domain control member than the second meeting point.

2. The system as claimed in claim 1, wherein the cross-sectional area of the domain conduit is larger than the cross-sectional area of each of the gas lines.

3. The system as claimed in claim 1, wherein the domain control member is a blower or a pump.

4. The system as claimed in claim 1, wherein the local control members are throttle valves.

5. A method for processing wafers, comprising:

processing the wafers by a first process module and a second process module;

producing an exhaust flow from the first process module and the second process module to a domain conduit by a domain control member, wherein a portion of the exhaust flow from the first process modules flows to the domain conduit via a first gas line, and a portion of the exhaust flow from the second process modules flows to the domain conduit via a second gas line;

detecting the exhaust pressure in the first gas line and the second gas line;

adjusting the flow rates of the exhaust flow in the first gas line if the exhaust pressure in the first gas line fails to meet a first set point; and adjusting the flow rates of the exhaust flow in the second gas line if the exhaust pressure in the second gas line fails to meet a second set point;

wherein the first gas line and the second gas line are respectively connected to the domain conduit at a first meeting point and a second meeting point, wherein the first meeting point is further away from the domain control member than the second meeting point; and wherein the flow rate of the exhaust flow in the first gas line is adjusted based on a signal from a first sensor for detecting the exhaust pressure in the first gas line, and the flow rate of the exhaust flow in the second gas line is adjusted based on a signal from a second sensor for detecting the exhaust pressure in the second gas line.

6. The method as claimed in claim 5, wherein the exhaust flow is regulated by adjusting the velocity of the exhaust flow.

7. The method as claimed in claim 5, further comprising detecting the exhaust pressure in domain conduit.

8. The method as claimed in claim 5, wherein the first set point is set according to the temperature in the first process module, and the second set point is set according to the temperature in the second process module.

9. The method as claimed in claim 5, wherein the first set point is set according to the concentration of toxic gas in the first process module, and the second set point is set according to the concentration of toxic gas in the second process module.

10. The system as claimed in claim 1, wherein the cross-sectional area of the domain conduit is larger than the cross-sectional area of each of the gas lines, and the domain conduit comprise a closed end and an open end, wherein the domain control member is positioned adjacent to the open end, and the first meeting point is closer to the closed end than the second meeting point.

11. The method as claimed in claim 5, wherein the cross-sectional area of the domain conduit is larger than the cross-sectional area of each of the gas lines, and the exhaust flow is actuated by the domain control member to flow away from a closed end to an opened end of the domain conduit, wherein the first meeting point is closer to the closed end than the second meeting point.

* * * * *